(12) United States Patent
Beaman

(10) Patent No.: US 10,516,223 B2
(45) Date of Patent: Dec. 24, 2019

(54) LGA SOCKET WITH IMPROVED HIGH-SPEED DIFFERENTIAL SIGNAL PERFORMANCE

(71) Applicant: International Business Machines Corporation, Armonk, NY (US)

(72) Inventor: Brian Beaman, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/614,837

(22) Filed: Jun. 6, 2017

(65) Prior Publication Data

US 2018/0351276 A1      Dec. 6, 2018

(51) Int. Cl.
  *H01R 12/57*   (2011.01)
  *H01L 41/09*   (2006.01)
  *H01R 13/24*   (2006.01)
  *H01R 12/71*   (2011.01)

(52) U.S. Cl.
  CPC ........... *H01R 12/57* (2013.01); *H01L 41/094* (2013.01); *H01R 13/2492* (2013.01); *H01R 12/716* (2013.01)

(58) Field of Classification Search
  CPC .. H01R 23/722; H01R 9/096; H01R 13/2442; H01R 12/57; H01R 13/2492; H01R 12/716; H01L 41/094
  USPC ................................................... 439/862, 66
  See application file for complete search history.

(56) References Cited

U.S. PATENT DOCUMENTS

| | | | |
|---|---|---|---|
| 4,538,878 A * | 9/1985 | Dambach | H01R 12/58 29/739 |
| 5,290,181 A | 3/1994 | Bixler et al. | |
| 5,772,451 A * | 6/1998 | Dozier, II | B23K 20/004 257/E21.503 |
| 6,152,790 A * | 11/2000 | Morris | H01R 13/26 439/862 |
| 6,293,808 B1 | 9/2001 | Ochiai | |
| 6,309,262 B1 * | 10/2001 | Morris | H01R 13/115 439/862 |
| 6,719,569 B2 * | 4/2004 | Ochiai | H01R 13/2435 439/66 |
| 6,971,885 B2 * | 12/2005 | Mowry | H01R 11/03 439/66 |

(Continued)

OTHER PUBLICATIONS

Tracy et al., "Array Sockets and Connectors Using MicroSpring/sup TM/technology", Twenty-Sixth IEEE/CPMT International Electronics Manufacturing Technology Symposium, 2000, 12 pages.

(Continued)

*Primary Examiner* — Gary F Paumen
(74) *Attorney, Agent, or Firm* — Cantor Colburn LLP; Tihon Poltavets

(57) ABSTRACT

Embodiments are directed to an electrical contact for use in an LGA connector having a split beam cantilever. The contact includes a base adapted for retention in an LGA connector. The contact also includes two cantilever beams extending from the base. The cantilever beams are each connected to the base at a first end of each respective cantilever beam. The contact includes a neck defining a region where a second end of each the two cantilever beams are connected. A contact tip extends from the neck.

13 Claims, 5 Drawing Sheets

(56) References Cited

U.S. PATENT DOCUMENTS

| | | | |
|---|---|---|---|
| 7,189,077 B1* | 3/2007 | Eldridge | G01R 3/00 |
| | | | 257/E21.582 |
| 7,189,080 B2 | 3/2007 | Tang et al. | |
| 7,245,137 B2 | 7/2007 | Eldridge et al. | |
| 7,322,829 B2* | 1/2008 | Ma | H01R 13/2442 |
| | | | 439/66 |
| 7,357,665 B1* | 4/2008 | Yan | H01R 13/2442 |
| | | | 439/500 |
| 7,555,834 B2 | 7/2009 | Perugini | |
| 7,798,822 B2 | 9/2010 | Eldridge et al. | |
| 8,123,529 B2* | 2/2012 | Beaman | H01R 13/2407 |
| | | | 439/66 |
| 8,366,453 B2* | 2/2013 | Chang | H01R 12/58 |
| | | | 439/66 |
| 8,681,596 B2 | 3/2014 | Heck | |
| 9,320,144 B2 | 4/2016 | Rathburn | |
| 2002/0182901 A1* | 12/2002 | Koopman | H05K 3/325 |
| | | | 439/66 |
| 2007/0042615 A1* | 2/2007 | Liao | H01R 13/2435 |
| | | | 439/66 |
| 2010/0323564 A1* | 12/2010 | Clark | H01R 13/2457 |
| | | | 439/862 |
| 2011/0151688 A1 | 6/2011 | Beaman | |
| 2017/0365947 A1* | 12/2017 | Costello | H01R 13/2442 |
| 2018/0351277 A1* | 12/2018 | Beaman | H01L 41/094 |

OTHER PUBLICATIONS

Beaman, Brian "LGA Socket with Improved High-Speed Differential Signal Performance," U.S. Appl. No. 15/857,690, filed Dec. 29, 2017.

List of IBM Patents or Patent Applications Treated as Related (Appendix P); Filed Dec. 29, 2017, 2 pages.

* cited by examiner

LGA SOCKET WITH IMPROVED HIGH-SPEED DIFFERENTIAL SIGNAL PERFORMANCE

BACKGROUND

The present invention generally relates to integrated circuit component second level (package-to-board) interconnections. More specifically, the present invention relates to a Land Grid Array (LGA) socket contact with a split beam cantilever.

Integrated circuit (IC) second level package-to-board interconnections (also known as component sockets) are employed to couple an IC package to a printed circuit board (PCB). Various component sockets have been developed for providing electrical connections between an IC package and a PCB, such as Pin Grid Array (PGA) connectors, Ball Grid Array (BGA) connectors, and Land Grid Array (LGA) connectors, the names of which are assigned thereto based on the conductive elements of the IC package that the connectors electrically connect. Contacts resided within the respective connectors are accordingly classified as PGA contacts, BGA contacts, LGA contacts, and so on. Conventional LGA socket housing typically includes a contact carrier having a plurality of cavities. The cavities house electrically conductive contacts and are used to provide the signal and power connections between the IC package, such as a computer processor, and the PCB, such as a motherboard.

SUMMARY

Embodiments of the present invention are directed to an electrical contact for use in an LGA connector having a split beam cantilever. A non-limiting example of the contact includes a base adapted for retention in an LGA connector. The contact also includes two cantilever beams extending from the base. The cantilever beams are each connected to the base at a first end of each respective cantilever beam. The contact includes a neck defining a region where a second end of each the two cantilever beams are connected. A contact tip extends from the neck.

Embodiments of the present invention are directed to an electrical contact having a split beam cantilever. A non-limiting example of the contact includes a base and a split beam cantilever extending from the base. The split beam cantilever includes a first beam and a second beam. The contact includes a neck defining a region where a first end of the first and second beams is connected. A contact tip extends from the neck.

Embodiments of the present invention are directed to an LGA socket assembly. A non-limiting example of the LGA socket assembly includes a contact carrier having an array of cavities. A LGA contact is disposed in each cavity. Each LGA contact includes a base and a split beam cantilever extending from the base. The split beam cantilever includes a first beam and a second beam. The LGA contact includes a neck defining a region where a first end of the first and second beams is connected. A contact tip extends from the neck.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
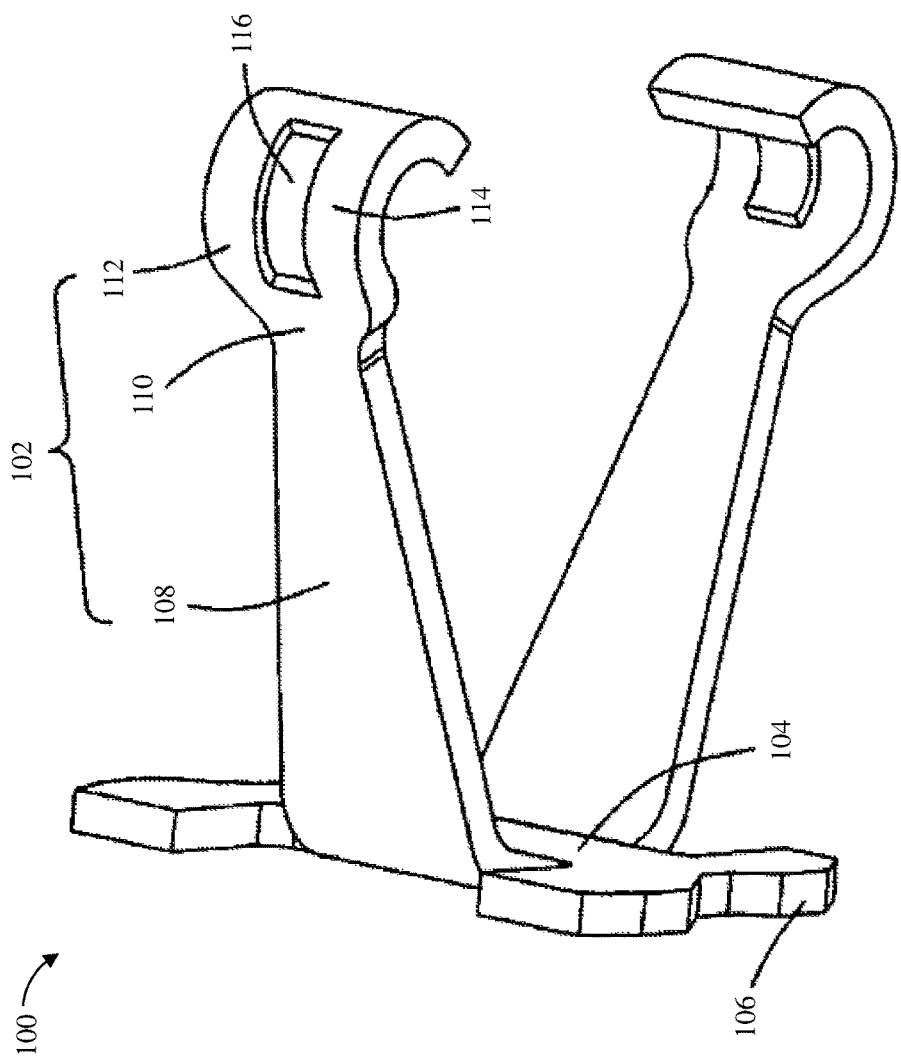
FIG. 1 depicts a perspective view of a conventional LGA contact.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, LGA socket housing typically includes a contact carrier having a plurality of cavities. The cavities house electrically conductive contacts and are used to provide the signal and power connections between an IC package and a PCB. There are challenges, however, in designing LGA contacts that can satisfy continuously increasing processor performance requirements. As semiconductor devices are designed to pack more transistors in the silicon and more than one silicon chip on the package, the number of required second level interconnects grows tremendously. Moreover, as processor performance requirements continue to push towards higher speeds, the signal integrity performance characteristics of these LGA contacts have become critical to the overall performance of the package.

To optimize the LGA contact signal integrity it is important to minimize impedance variations, also known as differential impedance, of a signal as it is transmitted through the LGA contact. The geometry of a given contact affects both the electrical and mechanical performance of the LGA socket. Differential impedance can be reduced by increasing the width of the cantilever beam of the LGA contact. Doing so, however, results in a reduction in mechanical performance. The force required to deflect a contact increases proportionally with the width of the beam.

Consequently, conventional LGA contacts suffer from a relatively large differential impedance as a signal is transmitted through the contact. This sharp change in differential impedance causes a reflection in the transmitted signal energy, degrading signal quality and limiting package performance. A modification to the design of conventional LGA socket contacts is desirable to improve signal integrity performance.

Turning now to an overview of aspects of the present invention, one or more embodiments of the invention provide a LGA contact having a split beam cantilever. Advantageously, the split beam design allows for the total width of the beam to be increased without substantially increasing the force required to deflect the contact. Moreover, the contact design is compatible with existing LGA socket manufacturing techniques.

Turning now to a more detailed description of aspects of the present invention, FIG. 1 depicts a perspective view of an LGA contact 100 for use in an LGA socket housing (not depicted). The LGA contact 100 includes one or more cantilever-type beams 102 extending from a base 104. The base 104 includes one or more barbs 106 formed on opposite sides or ends of the base 104. The barbs 106 retain the LGA contact 100 in a cavity of the LGA socket. Each cantilever beam 102 includes an extending section 108, a neck 110 (also known as a connecting section), and a contact tip 112. The contact tip 112 extends from the cantilever beam 102 and is adapted to engage a mating contact (not shown) of an IC package. The contact tip 112 can include one or more prongs 114 and can include a contact tip recess or void 116 for separating portions of the prongs 114.

The base 104 can include a solder terminal portion (also known as a paddle, not shown) adapted to receive a soldering material, such as a solder ball, for coupling the LGA contact 100 to a PCB. As discussed previously herein, the differential impedance of a signal transmitted through the LGA contact 100 can be reduced by increasing the width of the cantilever beam 102. Doing so, however, degrades the mechanical performance of the LGA contact 100, as deforming the cantilever beam 102 becomes more difficult as the thickness of the cantilever beam 102 increases.

Figure 2:
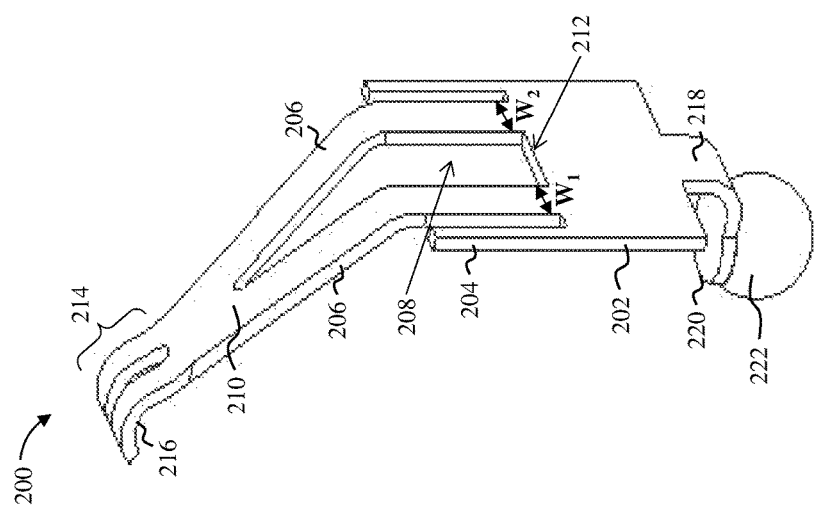
FIG. 2 depicts a perspective view of a LGA contact formed according to one or more embodiments of the present invention.
Figure 4:
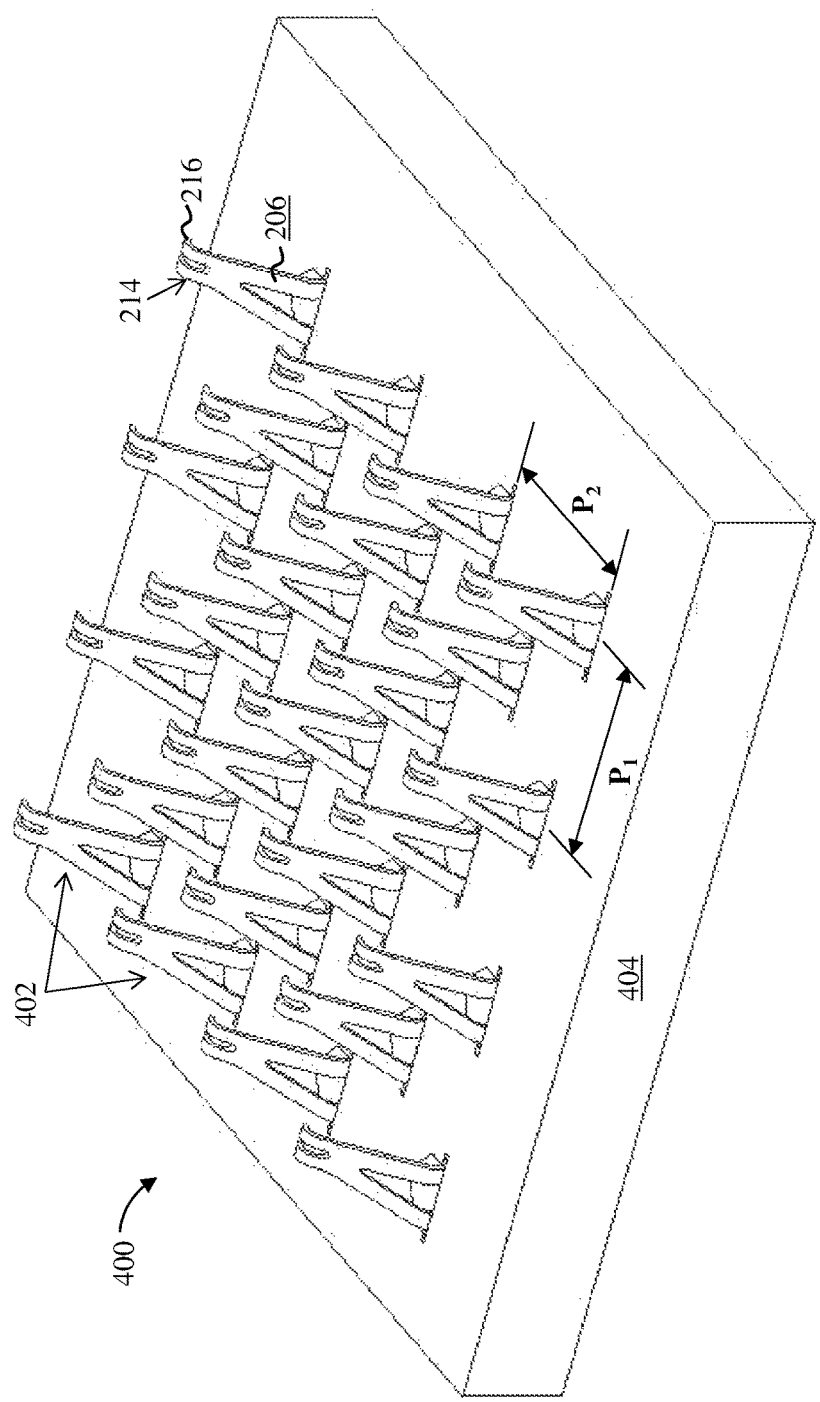
FIG. 4 depicts a top side perspective view of an LGA socket housing formed according to one or more embodiments of the present invention.

FIG. 2 depicts a perspective view of an LGA contact 200 (also known as an electrical contact for use in an LGA connector) formed during an intermediate operation of a method of fabricating an LGA contact according to one or more embodiments of the invention. The LGA contact 200 includes a base 202 having one or more barbs 204 for retaining the LGA contact 200 in an LGA socket housing (as depicted in FIG. 4). A split beam cantilever 206 including a first beam and a second beam extends from the base 202. The split beam cantilever 206 includes a void 208 that extends from an edge of the base 202 to a neck 210 of the LGA contact 200. In some embodiments of the present invention, a bottom edge 212 of the void 208 is coplanar with a base of the barbs 204.

The total width of the split beam cantilever 206 is equal to the total of the width $W_1$ of the first beam and the width $W_2$ of the second beam. The total cantilever width (i.e., $W_1+W_2$) defines the mechanical characteristics of the LGA contact 200 (e.g., a deflection force required to deform the LGA contact 200). The size and shape of the void 208 can be adjusted to tune the final physical properties of the LGA contact 200. For example, a width of the void 208 can be decreased to increase the total cantilever width $W_1+W_2$, thereby increasing the deflection force required to deform the LGA contact 200.

In some embodiments of the present invention, a contact tip 214 extends from the neck 210 and is adapted to engage a mating contact of an IC package (not shown). In some embodiments of the present invention, the mating contact is a pad of a processor module. In some embodiments of the present invention, the contact tip 214 includes one or more prongs 216. Terminating the contact tip 214 with one or more prongs 216 provides a dual or multi tip configuration which is useful for improved contact interface reliability performance. In some embodiments of the present invention, the prongs 216 are only coupled at a bottom portion of the contact tip 214. In some embodiments of the present invention, the prongs 216 are also coupled by a prong connection (not depicted).

Figure 5:
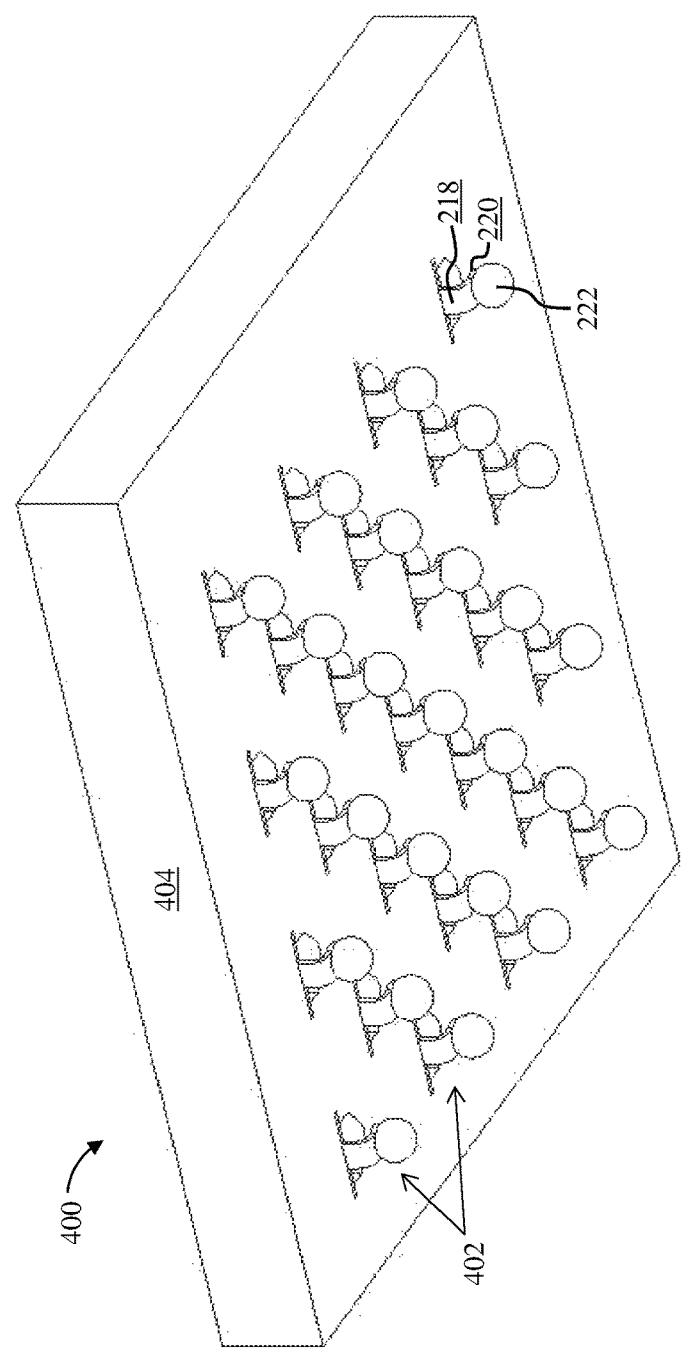
FIG. 5 depicts a bottom side perspective view of the LGA socket housing formed according to one or more embodiments of the present invention.

In some embodiments of the present invention, a tail portion 218 extends from a surface of the base 202 opposite the split beam cantilever 206. The tail portion 218 is coupled to a paddle 220 adapted to receive a soldering material, such as a solder ball 222. The paddle 220 and solder ball 222 extend from a bottom end of the LGA socket for coupling to a PCB (as depicted in FIG. 5).

Figure 3:
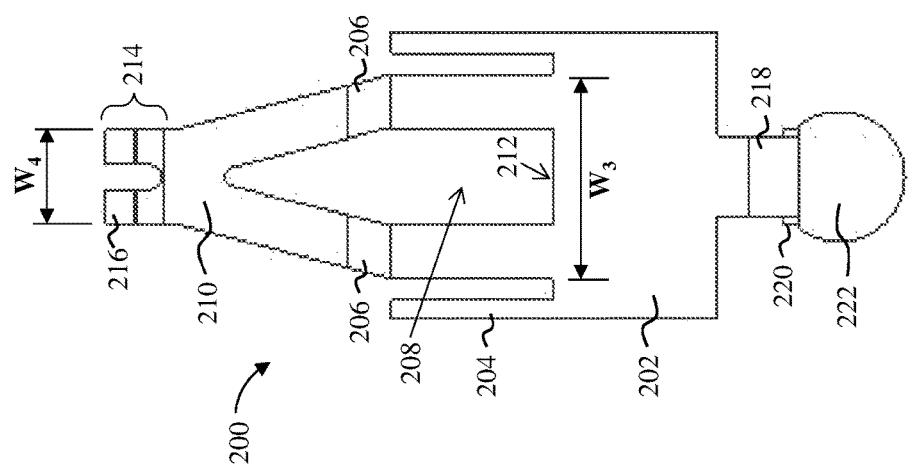
FIG. 3 depicts a second perspective view of the LGA contact formed according to one or more embodiments of the present invention.

FIG. 3 depicts a second perspective view of the LGA contact 200 formed during an intermediate operation of a method of fabricating an LGA contact according to one or more embodiments of the invention. The second view is rotated with respect to the first view (depicted in FIG. 2). From the second view, it is clear that the width $W_1$ of the first beam and the width $W_2$ of the second beam are substantially equal. Consequently, the mechanical deflection of the split beam cantilever 206 is uniform and is not subject to a torsional twist.

As discussed previously herein, the total width $W_1+W_2$ of the split beam cantilever 206 defines the mechanical characteristics of the LGA contact 200. The electrical characteristics (e.g., impedance characteristics) of the LGA contact 200, however, are defined by a contact width $W_3$ of the LGA contact 200 (i.e., a total width of $W_1$, $W_2$, and a width of the void 208). The length of the contact width $W_3$ can be adjusted to tune the final electrical properties of the LGA contact 200. For example, the length of $W_3$ can be increased to decrease the differential impedance of a signal transmitted through the LGA contact 200 without affecting the mechanical characteristics of the LGA contact 200. In this manner, the split beam cantilever design advantageously decouples the mechanical and electrical characteristics of the LGA contact 200. Consequently, the LGA contact 200 can have a larger contact width $W_3$ than a conventional LGA contact having a single beam cantilever design for a given deflection force.

In some embodiments of the present invention, a width $W_4$ of the contact tip 214 is substantially smaller than the contact width $W_3$ (i.e., $W_4$ is less than about one half the length $W_3$). Sizing $W_4$ to be substantially smaller than $W_3$ allows for an accurate alignment of the contact tip 214 to the contact pad in the IC module package (not shown). In other words, it is easier to align the LGA contact 200 to a mating contact if the LGA contact 200 is provided with a contact tip 214 having a relatively small width. In some embodiments of the present invention, the width $W_3$ is about 0.50 mm and the width $W_4$ is about 0.23 mm, although other lengths are within the contemplated scope of the invention.

FIG. 4 depicts a top side perspective view of an LGA socket 400 (also known as an LGA connector) having a plurality of LGA contacts 402 disposed in a contact carrier 404 (also known as a contact housing) according to one or more embodiments of the invention. The contact carrier 404 includes an array of cavities for housing the LGA contacts 402. The LGA contacts 402 are spaced apart by a horizontal pitch $P_1$ and a vertical pitch $P_2$. The horizontal pitch $P_1$ and the vertical pitch $P_2$ can be substantially equal (to provide a uniform contact pitch), or the horizontal pitch $P_1$ can be larger or smaller than the vertical pitch $P_2$. In some embodiments of the present invention, the horizontal pitch $P_1$ and the vertical pitch $P_2$ are about 1.5 mm, although other pitch dimensions are within the contemplated scope of the invention.

Each of the LGA contacts 402 sit in a cavity of the contact carrier 404 such that a top surface of the barbs 204 lies at or below a surface of the LGA socket 400. Portions of the split beam cantilever 206 of each of the LGA contacts 402 above the top surface of the barbs 204 protrude from the surface of the LGA socket 400. In this manner, the split beam cantilever 206 can be deformed to bring the contact tip 214 and prongs 216 into contact with an IC package (not depicted).

FIG. 5 depicts a bottom side perspective view of the LGA socket 400 having a plurality of LGA contacts 402 disposed in a contact carrier 404 according to one or more embodiments of the invention. Portions of the tail portion 218 and the paddle 220 for each of the LGA contacts 402 protrude from a bottom surface of the LGA socket 400. Each paddle 220 is coupled to a solder ball 222. In this manner, the LGA contacts 402 can be coupled to a PCB (not shown).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An electrical contact for use in a land grid array (LGA) connector, the electrical contact comprising:
    a base having one or more barbs adapted for retention in the LGA connector, the base comprising a first surface, wherein a first end of each of the barbs is coupled to the first surface of the base and a second end of each of the barbs is not coupled to the base;
    a first cantilever beam extending from the first surface of the base, the first cantilever beam connected to the first surface of the base at a first end of the first cantilever beam;
    a second cantilever beam extending from the first surface of the base, the second cantilever beam connected to the first surface of the base at a first end of the second cantilever beam;
    a neck defining a region where second ends of the first and second cantilever beams are connected;
    a contact tip extending from the neck; and
    a tail portion extending from a second surface of the base opposite the first surface of the base, the tail portion comprising a paddle and a solder ball configured to extend from a bottom end of the LGA connector for coupling to a printed circuit board (PCB);
    wherein the first cantilever beam and second cantilever beam define an aperture between the base and the neck, wherein a bottom edge of the aperature is coplanar with the first end of each of the barbs, wherein each of the barbs are coplanar with the base, and wherein the first cantilever beam and the second cantilever beam extend from a top end of the LGA connector.

2. The electrical contact of claim 1, wherein the first ends of the first and second cantilever beams are coplanar.

3. The electrical contact of claim 1, wherein the first ends of the first and second cantilever beams are coplanar to a first end of a barb.

4. The electrical contact of claim 1 further comprising one or more prongs extending from the contact tip.

5. The electrical contact of claim 1, wherein each prong comprises a width less than a width of the contact tip.

6. An electrical contact, the electrical contact comprising:
    a base having one or more barbs, wherein a first end of each of the barbs is coupled to a first surface of the base and a second end of each of the barbs is not coupled to the base;
    a split beam cantilever extending from the first surface of the base, the split beam cantilever comprising a first beam and a second beam;
    a neck defining a region where first ends of the first and second beams are connected;
    a contact tip extending from the neck; and
    a tail portion extending from a second surface of the base opposite the first surface of the base, the tail portion comprising a paddle and a solder ball configured to extend from a bottom end of a land grid array (LGA) connector for coupling to a printed circuit board (PCB);
    wherein the first beam and the second beam define an aperture between the base and the neck, wherein a bottom edge of the aperture is coplanar with the first end of each of the barbs, wherein each of the barbs are coplanar with the base, and wherein the split beam cantilever extends from a top end of the LGA connector.

7. The electrical contact of claim 6, wherein the first cantilever beam is connected to the base at a second end of the first cantilever beam and the second cantilever beam is connected to the base at a second end of the second cantilever beam.

8. The electrical contact of claim 6, wherein the second ends of the first and second cantilever beams are coplanar.

9. The electrical contact of claim 8, wherein a first end of each of the barbs is coupled to the base and a second end of each of the barbs is not coupled to the base.

10. The electrical contact of claim 6, wherein the second ends of the first and second cantilever beams are coplanar to a first end of a barb.

11. The electrical contact of claim 6 further comprising one or more prongs extending from the contact tip.

12. The electrical contact of claim 6, wherein each prong comprises a width less than a width of the contact tip.

13. A land grid array (LGA) socket assembly comprising:
    a contact carrier comprising an array of cavities; and
    a LGA contact disposed in each cavity, each LGA contact comprising:
        a base having one or more barbs, wherein a first end of each of the barbs is coupled to a first surface of the base and a second end of each of the barbs is not coupled to the base;
        a split beam cantilever extending from the first surface of the base, the split beam cantilever comprising a first beam and a second beam;
        a neck defining a region where first ends of the first and second beams are connected;
        a contact tip extending from the neck; and
        a tail portion extending from a second surface of the base opposite the first surface of the base, the tail portion comprising a paddle and a solder ball configured to extend from a bottom end of the contact carrier for coupling to a printed circuit board (PCB);
        wherein the first beam and second beam define an aperture between the base and the neck, wherein a bottom edge of the aperature is coplanar with the first end of each of the barbs, wherein each of the barbs are coplanar with the base, and wherein the split beam cantilever extends from a top end of the contact carrier.

* * * * *